United States Patent [19]

Markow et al.

[11] Patent Number: 5,004,976
[45] Date of Patent: Apr. 2, 1991

[54] WYE WINDING RADIAL AIR-CORE GAUGE SYSTEM

[75] Inventors: Paul A. Markow, Huntsville; William Nolle, Hazel Green; Charles L. Bell, Huntsville, all of Ala.

[73] Assignee: Chrysler Corporation, Highland Park, Mich.

[21] Appl. No.: 431,129

[22] Filed: Nov. 3, 1989

[51] Int. Cl.$^5$ .............................................. G01R 1/00
[52] U.S. Cl. ................................ 324/154 R; 324/144; 324/146; 324/151 A
[58] Field of Search ............... 324/140 R, 140 D, 144, 324/146, 147, 151 R, 151 A, 154 R, 157, 160, 166, 173, 174, 611

[56] References Cited
U.S. PATENT DOCUMENTS 2,345,936  4/1944  Jewell .................................. 324/146
4,443,795  4/1984  Fowler .............................. 324/146 X Primary Examiner—Kenneth Wieder
Assistant Examiner—Robert W. Mueller
Attorney, Agent, or Firm—Wendell K. Fredericks

[57] ABSTRACT

A wye-type air-core gauge system provides magnitude indications of measurands in response to PWM signals generated by a control unit that receives electrical signals from a sensor that represents magnitude variations of the measurand. The size of the stator coils of the gauge makes possible a very low profile gauge suitable for mounting in an instrument cluster.

7 Claims, 3 Drawing Sheets

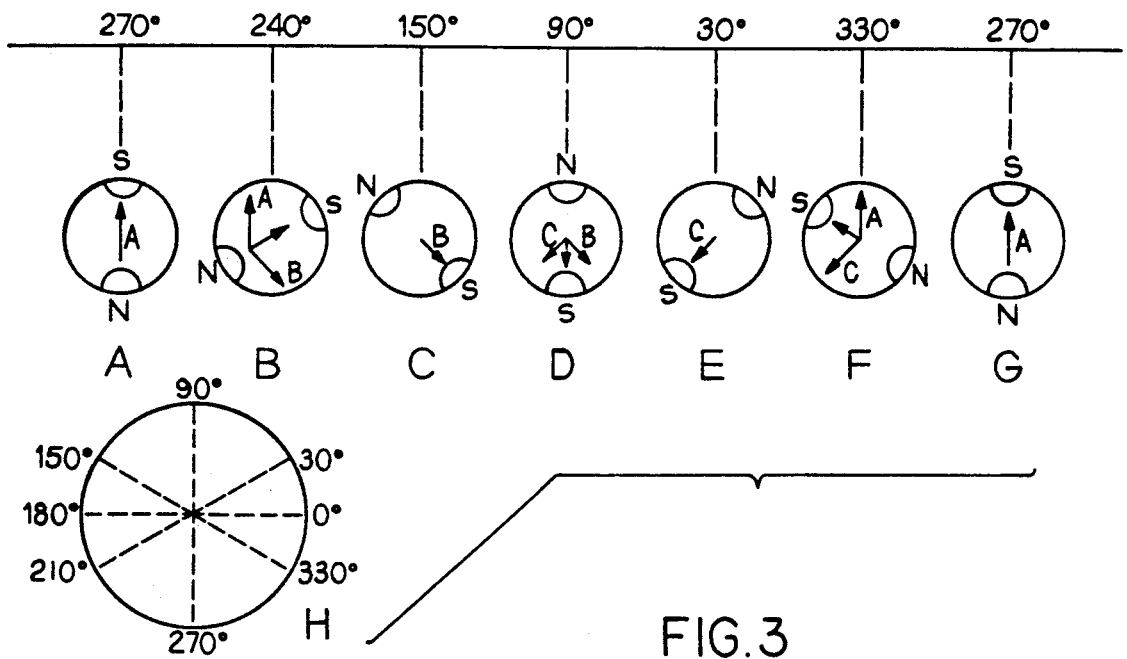
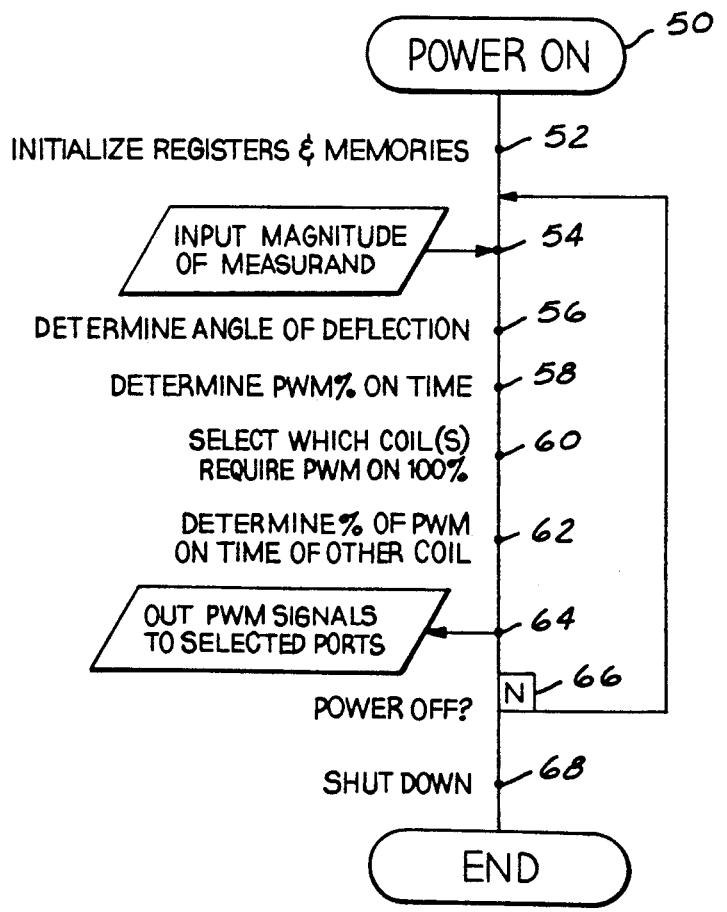
FIG.3
FIG.4

WYE WINDING RADIAL AIR-CORE GAUGE SYSTEM

BACKGROUND OF THE INVENTION

1. Field of the Invention

The present invention relates generally to novel air-core gauges employing magnetic field techniques, and particularly to air-core gauges and magnetic field techniques therefor which control orienting radially magnetized rotors over an infinite number of angular displacements using wye type stator windings.

2. Description of the Prior Art

A problem exist in the prior art in forming low profile air-core gauges for installation in instrument panels and dash boards of various structures and equipment. Most aircore gauges employ cross-coil arrangements whereby one cross coil affects interaction with the magnetic rotor differently than the other cross coil since the magnetic proximity to the rotor of the two coils differ Reissued U.S. Pat. No. Re. 32,604 dated Feb. 16, 1988 of A.L. Reenstra describes such a coil arrangement Such a coil arrangement appears to not address the issue of providing a low profile gauge for the various equipments since the bulky sizes of the gauges remain.

A co-pending application of P. Markow et al., Ser. No. 07/431,130, entitled "Radial Air-core Gauge" filed Nov. 3, 1989 teaches a low profile air-core gauge having 90 degree stator windings. Such an arrangement yields interchangeable radial coils which equally affect interaction with the magnetic rotor. Such an arrangement virtually eliminates any positional errors due to unbalanced stator winding fields This gauge provides a low profile instrument which gives the instrument panel designer more space in which to work.

However, a need exists for even further reduction in size of the gauge and for the type of gauge that uses simpler and cheaper control drivers. A search was initiated to find such an air-core gauge device. That search ended in the device of the present invention.

BRIEF SUMMARY OF THE INVENTION

The present invention concerns rotor aligning in a novel 120 degree radial type air-core gauge. Individual stator coils on individual coil forms insert in radially space pockets about a non-metallic thin wall cup that houses a bipolar-magnetized rotor. Each stator coil, wound for interchangeability, contains equal numbers of turns of the same size and resistance wire and wound so that poles located 120 degrees from the other will have the same polarity (N and N or S and S). With the radii of the coils less than the length of the coils, as in this invention, a smaller profile gauge results.

The end terminal of the wye stator coils, near the cup, connects to a common source voltage node while an input terminal of each coil receives pulse width modulated signals (PWM) for generating independent magnetic flux fields. A resultant magnetic field of the stator coils interact with a magnetic field of a radially magnetized rotor to cause rotation of the rotor. Alternating between holding a single coil at a maximum PWM duration and holding one coil at the maximum PWM duration along with another at a lower duration causes the resultant magnetic field to rotate about a central axis of the rotor causing the rotor to move through an infinite number of angular displacements in response to the PWM changes. This technique permits using simpler control circuits since the PWM duration does not have to be varied in both coils simultaneously and permits bypassing the need to use circuits such as half-bridge drivers.

Also, winding the coils on individual coil forms permits use of conventional low cost core winding equipment and allows for highly efficient control of flux density values of each coil.

BRIEF DESCRIPTION OF THE DRAWING

FIG. 3 depicts in views A-H the rotating action of the magnetized rotor;

FIG. 4 presents a flow chart depicting the computer program used for controlling the wye coil radial aircore gauge system;

DETAILED DESCRIPTION OF A PREFERRED EMBODIMENT

Figure 1:
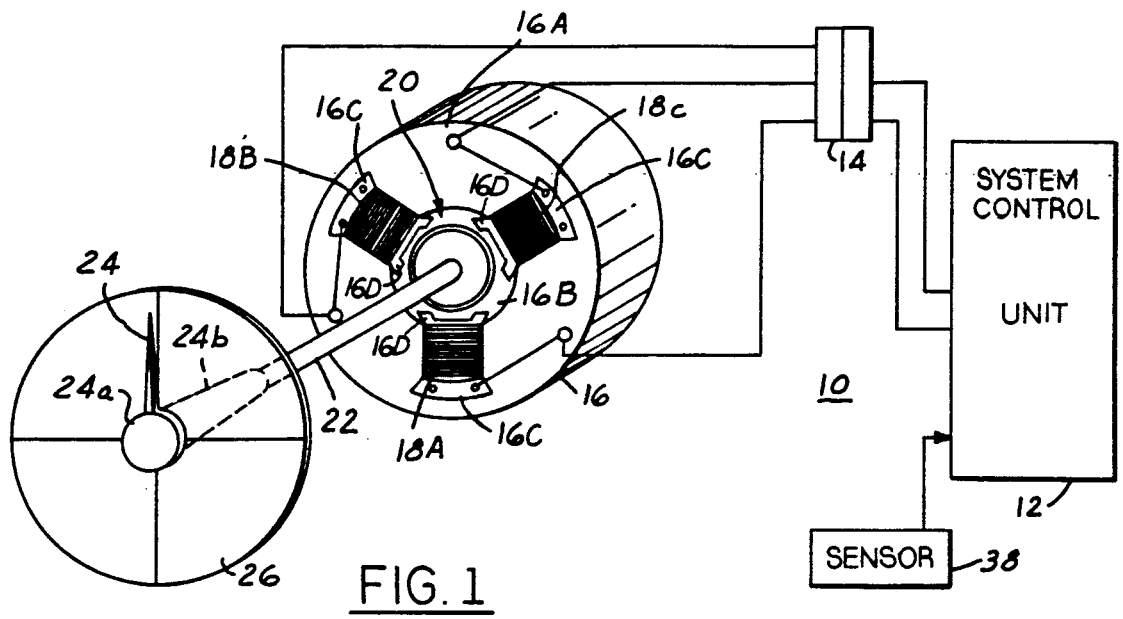
FIG. 1 presents a perspective view of a wye-stator winding, radial-type, air-core gauge connected to, in block diagram form, a system control unit for illustrating the present invention.

Referring now to FIG. 1, a perspective view depicts a wye-stator, radial-type, air-core gauge 16 and a block diagram that depicts a system control unit 12 and a measurand sensor 38 of the present invention. A pointer 24 moves over a dial face 26 in response to changes in orientation of a radially-magnetized rotor 20. The pointer 24 has a hub 24A and a hub sleeve 24B which fixedly attaches to a top end of a rotor shaft 22. The rotor 20 attaches near a bottom end of the shaft and rotates in a thin wall cup 16B within a coil-form housing 16A, the bottom end of the shaft rotating in a support bearing (not shown) centrally located at the bottom of the coil form housing 16A.

A rotor cover (not shown) that includes a sleeve bearing attached at one end, slidably mounts on shaft 22 over the permanent magnet bipolar rotor 20 and seats about an edge of cup 16B.

A protective metallic casing 16E surrounds the gauge structure for providing protection against electromagnetic interference and to provide a flux return path of the flux generated by the stator coils.

To ensure the generation of reasonably non-distorted and complementary electromagnetic fields, each coil form 16C receives the same number of turns of the same size wire from a conventional coil winder to form interchangeable coils 18A-18C.

With a front end of each coil inserted in a pocket 16D, the thin walls of cup 16B brings the rotor 20 in close magnetic proximity with each radially directed coil. The coil-form housing 16A includes the three pockets 16D, each pocket 16D disposed 120 degrees apart, for holding an end of a coil form 16C and a coil 18 wound thereon juxtaposed to the cup 16B.

Figure 2:
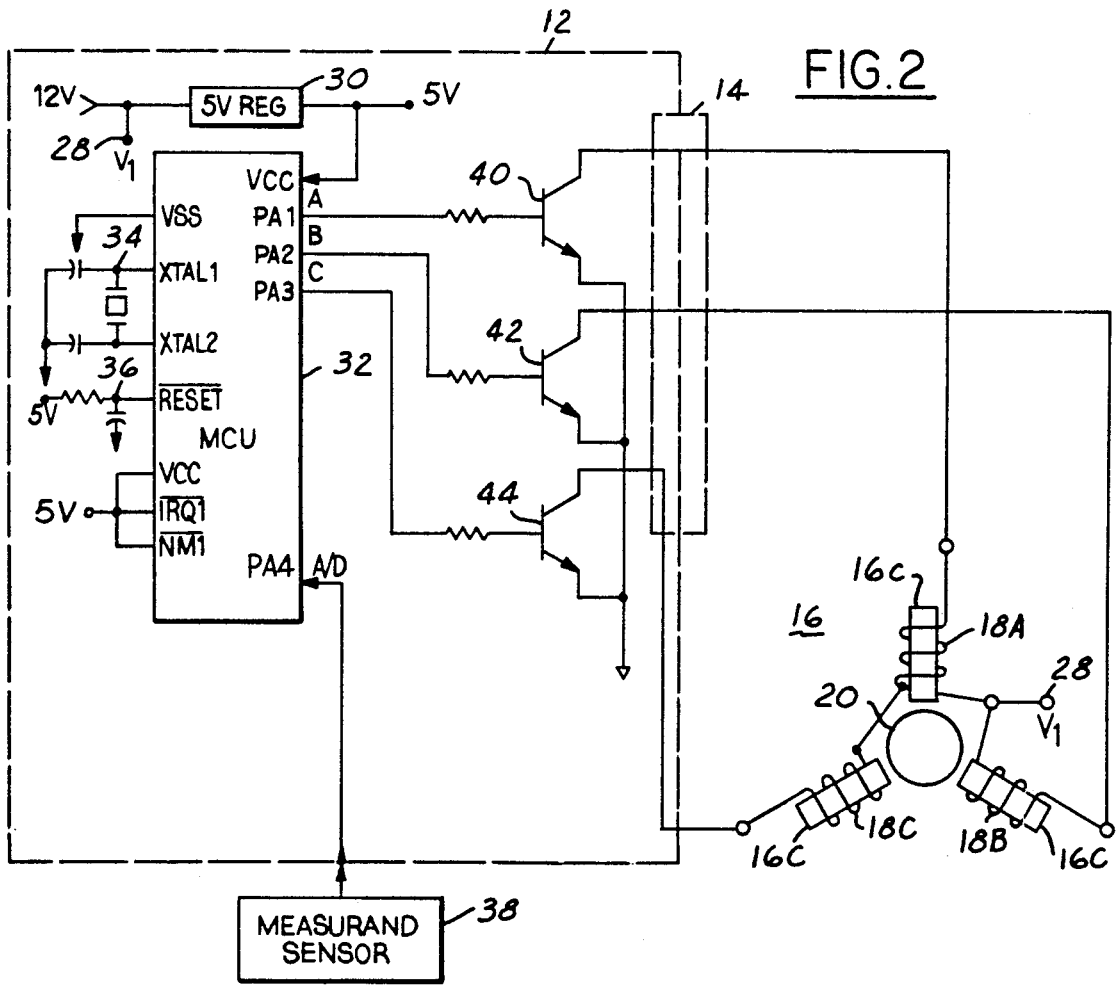
FIG. 2 illustrates in schematic diagram form the system shown in FIG. 1.

With reference now to FIG. 2, a first end of each of the three coils 18A-18C disposed 120 degrees apart about cup 16B, connect in parallel relationship to a source voltage V1 at terminal 28 while the input end of each coil (18A-18C) connects individually through connector 14 to transistor drivers 40, 42 and 44 respectively of a system control unit 12.

Voltage from a 12 VDC source applies to a 5-volt regulator 30 to establish a precise output 5 VDC to a microcontroller (MCU) 32. Regulator 30 also provides after an external delay from delay circuit 36, a 5 VDC signal for resetting MCU 32 during a power-on phase.

MCU 32, illustratively, a single chip 8-bit unit such as a Motorola MC68705S3 microcontroller, contains a CPU, on-chip clock, ROM, RAM, EPROM, timer, I/O lines and an A/D converter. An external oscillator 34 controls the on-chip clock while port A provides input/output lines PA1-PA4.

PA4, an input port to a built-in analog-to-digital converter, connects to a measurand sensor which senses a measurand such as oil pressure, water temperature speed etc. Ports PA1-PA3 provide MCU 32 generated pulse-width modulated signals that route to the base of transistor drivers 40,42 and 44 for controlling rotating resultant electromagnetic fields in cup 16B (shown in FIG. 1). These controlled fields interact with the magnetic field of the magnetic rotor 20 to cause rotor 20 to rotate about shaft 22 and the pointer 24 to move over dial 26 to indicate magnitudes in proportion to changes of the measurand.

FIG. 3 depicts the rotating action of rotor 20 in response to the magnitude and direction of the generated resultant magnetic field of individual coils and combination of individual coils (AC) interacting with the magnetic field of the rotor in cup 16B of gauge 16. To obtain these orientations, maximum duty cycles (i.e., on time per period) of the PWM signals to a single coil or a combination of coils illustratively, a 244 hertz signal apply.

OPERATION OF THE SYSTEM

To relate the operation of MCU 32 to sensing the magnitude of the measurand and the generation of the PWM signals, refer now to FIG. 4, a flowchart of the program executed by MCU 32 to generate the current flow.

The flowchart diagram of FIG. 4 contains symbols different from the conventional box and diamond flowchart symbols. In FIG. 4, the flow of control passes along the lines and proceeds down the page. Conventional start-up-of-program, end-of-program are represented by odd-long circle symbols and the conventional parallelogram denotes input or output operations. Actions are signified by a small circle or dot on the flow lines, with the description of the action placed to the left or right of the dot. Actions only take place on vertical lines. When a decision has to be introduced, the flow line branches to the right or left. The branch may be caused by either a yes or no condition, this being signified by a Y or N in a small box as indicated. Where secondary flow rejoins in main flow, an arrowhead is used. A reference number will indicate the point along the lines being discussed.

Figure 5:
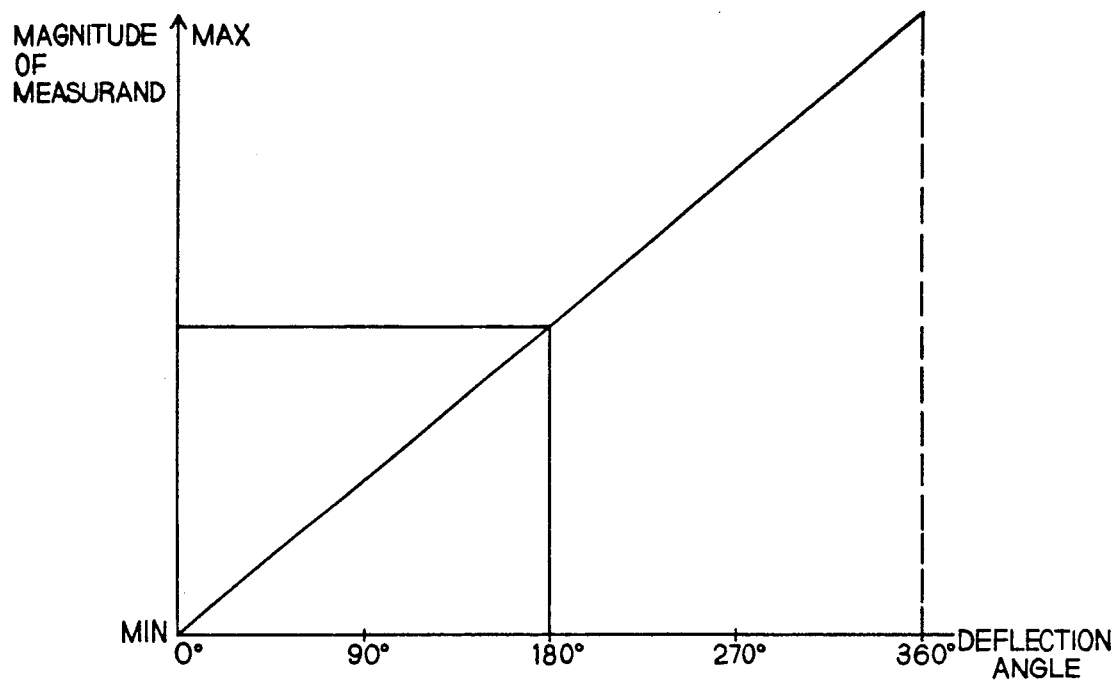
FIG. 5 depicts a look-up table used by MCU 32 to determine amount of deflection of the dial pointer relative to the magnitude of the/measurand.

When applying 12 VDC to turn system 10 ON (circle 50), after initialization of registers and memories in MCU 32 (dot 52), and in accordance with the main program, in response to variations of the magnitude of the measurands, MCU 32 inputs magnitude changes (dot 54). Then MCU 32 determines an angle of deflection corresponding to the magnitude detected (dot 56). MCU 32 looks at a look-up table similar to the one of FIG. 5 which shows the linear relationship between the magnitude of the measurand and the angle of deflection of pointer 24 over dial 26.

Figure 6:
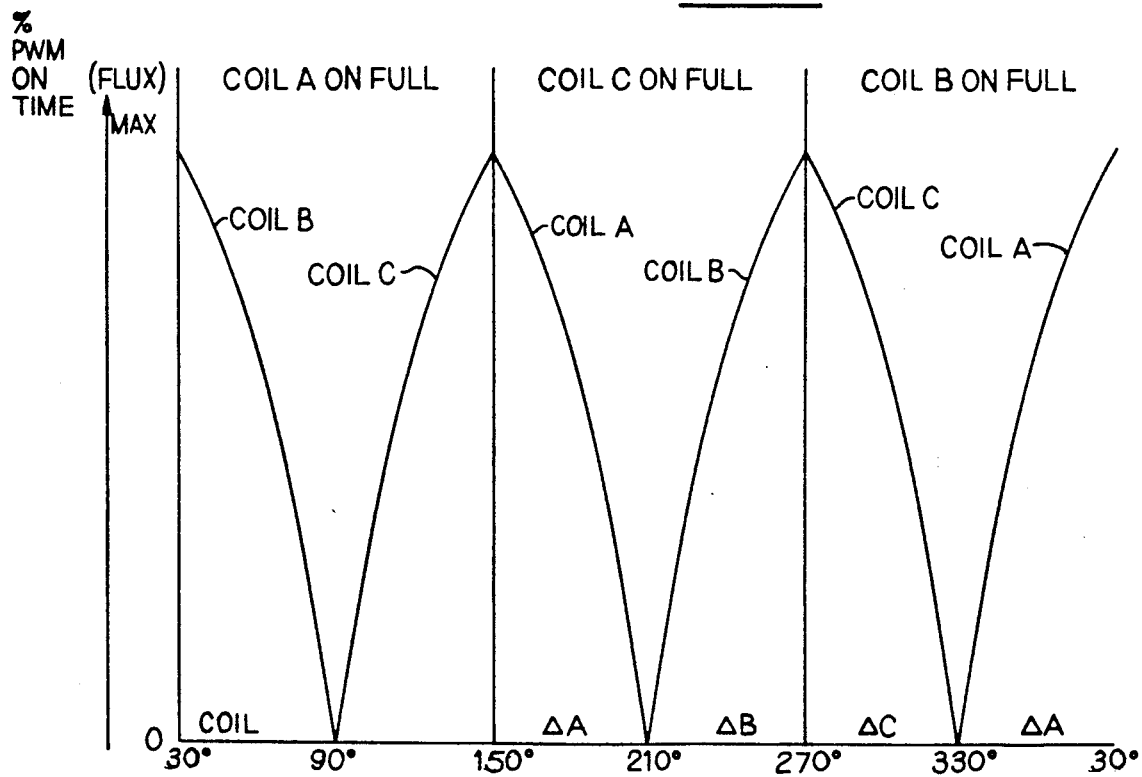
FIG. 6 depicts a look-up table used by MCU 32 to determine % on time of the PWM signal for the various wye coils.

After finding an angle that corresponds to the magnitude, MCU 32 then determines the amount of flux or the % of ON time (dot 58) of the PWM signal(s) required by one or more than one of the stator coils from a second look-up table similar to the one depicted in FIG. 6.

From the same look-up table, MCU 32 selects which coil or coils require 100% duration PWM signals (dot 60) and which ones require a shorter duration PWM signal (dot 62).

Then MCU 32 outputs to the appropriate output ports the proper duration logic signals to simulate the PWM signals (dot 64).

After outputting the PWM signals, MCU 32 determines as in decision box 66, whether or not the power is OFF. If not, then MCU 32 goes back and looks for the next measurand magnitude as indicated at dot 54.

This loop continues until MCU 32 is instructed to shut down (dot 68) and then the program ends.

The flux intensity needed to compute the PWM on times of FIG. 6 could be derived using vector algebra describing the individual flux and the resultant sums of the individual flux intensities as vectors.

The following equations represent the flux density or intensity (H) of the wye coils:

$$Ha/\_90° = Ha\cos(90°) + jHa\sin(90°) \quad (1)$$
$$= Ha(0) + jHa(1)$$

$$Hb/330° = Hb(+0.5) + jHb(-0.866) \quad (2)$$

$$Hc/240° = Hc(-0.5) + jHc(-0.866) \quad (3)$$

If equation (1) is summed with equation (2), equation (1) summed with equation (3), and equation (2) summed with equation (3), the following equations result:

$$Ha + Hb = 0.5Hb + jHa - jHb(0.866) \quad (4)$$

$$Ha + Hc = -0.5Hc + jHa(1) + jHc(-0.866) \quad (5)$$

$$Hb + Hc = 0.5Hb + -0.5Hc + jHb(-0.866) = jHc(-0.866) \quad (6)$$

The look-up table in FIG. 6 can be derived using the equations (1) through (6) and selected angles within the three deflection angle ranges denoted at the bottom of the table.

Each coil of the present invention, illustratively, has 1050 turns of number 40 gauge, 214 ohms wire. The coil's radii are 3.75 mm and length's are 2.5 mm. The rotor-to-stator air gap is about 0.9 mm. Maximum flux density is about 167 gauss with the maximum current of 0.114 amperes applied to a coil.

These stator coils present balanced electromagnetic fields which oppose lagging or leading of the dial pointer from the expected or desired magnitude of the sensed measurand.

A rotor-to-stator air gap of about 0.9 mm, with the length of each coil at about 2.5 mm, yields a low profile gauge of a height of a about 9.4 mm.

Another embodiment may include a gauge wherein the coil-form housing includes attached coil forms.

This disclosure shows and describes only a preferred embodiment of the invention. It is to be understood that the invention is capable of use in various other combinations and environments and is capable of changes or modification within the scope to the inventive concept as expressed herein.

We claim:

1. A wye winding type air-core gauge system for generating a movable electromagnetic field in a direction and of a field strength proportional to a magnitude and a direction of input electrical signals representing changes in magnitude of a measurand emanating from a measurand source, said system comprising:
    (a) wye-coil, radial air-core gauge means for providing a visual angular displacement indicative of changes in magnitude of the measurand;
    (b) sensor means having an input terminal connected to said measurand source for sensing the changes in magnitude of the measurand and to produce therefrom a series of electrical signals in a chosen format representing changes in magnitude of the measurand; and
    (c) control means adapted to receive said series of electrical signals and to produce therefrom combinations of maximum amounts of a voltage signal to a chosen coil of said gauge means and a series of pulse width modulated (PWM) signals at a chosen frequency and of durations to a selected second or third coil of said gauge in response to changes of magnitude of said series of magnitude signals for generating control signals to the chosen and selected coils of said gauge means which cause the occurrences of the visual angular displacements indicative of changes in magnitude of the measurand.

2. System in accordance with claim 1 wherein said gauge means includes: (a) a non-magnetic coil-form housing having a centrally located cup region and a first, a second and a third coil-form pocket disposed equally spaced apart and radially aligned about an outer circumferential surface of said cup region; (b) a bipolar-permanent magnet rotor attached near a bottom end of a shaft and radially magnetized to have a north and south pole regions space equally from a centroid, said rotor being disposed in said cup region of said housing and a bottom end of the shaft rotating in a support bearing centrally located at the bottom of said coil-form housing while a rotor cover containing a sleeve bearing slidably mounts over the top end of the shaft and over the rotor and seats about an edge of the centrally located support bearing; (c) dial face means spaced apart from said coil-form housing having a dial face containing a series of graduations, angularly but linearly arranged to indicate linear changes of the graduations, said dial face means also including a dial pointer having a hub that rotates about a central axis of said dial face for pointing to the graduations arranged on said dial face.

3. System of claim 2 wherein said coreform housing includes first, second and third core-form means, each of said core-form means having a mounting end configured to mate and to insert into said respective core-form pockets, said core-form means allowing individual coils to be wound thereon so as to permit highly efficient control of flux density values of each coil, each coil being interchangeable in the coil-form pockets of said coil-form housing.

4. System of claim 3 including first, second and third stator coil means disposed about said respective core-form means, each of said coil means having a first terminal connected in parallel to receive a source voltage associated with said PWM signal from said control means, and a second terminal connected individually to said control means for receiving said PWM signals, each of said coil means providing an electromagnetic field used to angularly rotate a resultant magnetic field about said rotatable shaft in response to changes in magnitude of the measurand and to interact with a magnetic field of said rotor to cause the magnetic field of the rotor to align with the resultant field, effecting movement of said dial pointer and wherein said control means provide: (1) a maximum control voltage signal to said first coil along with a width modulated pulse signal exclusively to said second coil and exclusively to said third coil to affect movement of said dial pointer in a first and second half respectively of a first, one-third region of said dial face; (2) a maximum control voltage signal to said third coil along with a width modulated pulse signal exclusively to said first and exclusively to said second coil to affect movement of said dial popinter in a first and second half respectively of a second, one-third region of said dial face and (3) a maximum control voltage signal to said second coil along with a width modulated pulse signal exclusively to said third and exclusively to said first coil to affect movement of said dial pointer in a first and second half respectively of a third, one-third region of said dial face.

5. System of claim 4 wherein said first, second and third stator coil means have substantially the same coil resistance, length, radius wire size and number of turns so as to generate substantially equal flux intensity for equal PWM signals and wherein said stator coils are wound individually.

6. System of claim 5 wherein said both length and width of said gauge, excluding said dial face and said pointer, is substantially small with respect to a radius of each coil of said first, second or third stator coils.

7. System of claim 3 wherein said coil-form housing includes integrally attached coil-form means.

* * * * *